(12) United States Patent
Sakuma et al.

(10) Patent No.: US 7,564,065 B2
(45) Date of Patent: Jul. 21, 2009

(54) LIGHT EMITTING DEVICE AND A LIGHTING APPARATUS

(75) Inventors: Ken Sakuma, Sakura (JP); Naoto Hirosaki, Tsukuba (JP)

(73) Assignees: Fujikura Ltd., Tokyo (JP); National Institute for Materials Science, Ibaraki (JP)

( * ) Notice: Subject to any disclaimer, the term of this patent is extended or adjusted under 35 U.S.C. 154(b) by 675 days.

(21) Appl. No.: 11/085,070

(22) Filed: Mar. 22, 2005

(65) Prior Publication Data

US 2007/0278510 A1      Dec. 6, 2007

(30) Foreign Application Priority Data

Mar. 22, 2004   (JP) .............................. P2004-83399

(51) Int. Cl.
   *H01L 33/00* (2006.01)
   *H01L 31/12* (2006.01)
   *H01J 1/62* (2006.01)
   *H01J 63/64* (2006.01)

(52) U.S. Cl. .............................. 257/80; 257/79; 257/81; 257/82; 257/83; 257/84; 257/88; 257/98; 257/99; 257/100; 257/101; 257/102; 257/103; 313/496; 313/497; 313/498; 313/499; 313/500; 313/501

(58) Field of Classification Search ............. 257/79–84, 257/88, 98–103; 313/496–501
   See application file for complete search history.

(56) References Cited

U.S. PATENT DOCUMENTS 6,717,353 B1 *   4/2004   Mueller et al. .............. 313/501

2003/0030038 A1 *   2/2003   Mitomo et al. .............. 252/500
2003/0094893 A1       5/2003   Ellens et al.
2006/0043337 A1 *   3/2006   Sakane et al. ......... 252/301.4 F

FOREIGN PATENT DOCUMENTS

EP       1104799 A1     6/2001
EP       1264873 A2    12/2002

(Continued)

OTHER PUBLICATIONS

"Development of High-bright and Pure-white LED Lamps", K. Bando, K. Sakano, Y. Noguchi and Y. Shimizu, J. Light & Vis. Env. vol. 22, No. 1 (1998), pp. 2-5.

(Continued)

*Primary Examiner*—Steven Loke
*Assistant Examiner*—Arman Khosraviani
(74) *Attorney, Agent, or Firm*—Sughrue Mion, PLLC

(57) ABSTRACT

The present invention provides in one embodiment a light emitting device that has a high efficacy even in a range of low color temperatures, a long-term reliability, and an improved color rendering property. In addition, the present invention provides in another embodiment a lighting apparatus using such a light emitting device. In the light emitting device, a mixture of a first phosphor material that emits yellow green, yellow or yellow orange light and a second phosphor material that emits light having a longer wavelength than the first phosphor material, for example, yellow orange or orange light is used as a phosphor. The first phosphor material is represented by a general formula $Ca_x(Si, Al)_{12}(O, N)_{16}:Eu_y^{2+}$ and a main phase thereof has an alpha-SiAlON crystal structure.

4 Claims, 9 Drawing Sheets

FOREIGN PATENT DOCUMENTS

| | | | |
|---|---|---|---|
| EP | 1278250 | A2 | 1/2003 |
| EP | 1296376 | A2 | 3/2003 |
| JP | H10-163535 | A | 6/1998 |
| JP | 2900928 | B2 | 3/1999 |
| JP | 2927279 | B2 | 5/1999 |
| JP | 2002-363554 | A | 12/2002 |
| JP | 2003-124527 | A | 4/2003 |
| JP | 2003-206481 | A | 7/2003 |
| JP | 2003-273409 | A | 9/2003 |
| JP | 2003-321675 | A | 11/2003 |
| JP | 2004-67837 | A | 3/2004 |
| JP | 2004-186278 | A | 7/2004 |
| JP | 2004-238505 | A | 8/2004 |

OTHER PUBLICATIONS

"Red-Enhanced White-Light-Emitting Diode Using a New Red Phosphor", M. Yamada, T. Naitou, K. Izuno, H. Tamaki, Y. Murazaki, M. Kameshima and T. Mukai, Jpn. J. Appl. Phys. vol. 42 (2003) pp. L20-L23.

"Performance, Thermal, Cost & Reliability challenges for Solid State Lighting", Paul S. Martin, OIDA Conference, May 30, 2002.

R.-J. Xie, et al., "Preparation and Luminescence Spectra of Calcium- and Rare-Earth (R= Eu, Tb, and Pr)-Codoped Alpha-SiAlON Ceramics", Journal of the American Ceramic Society, May 2002, pp. 1229-1234, vol. 85, No. 5, Blackwell Publishing, Malden, MA, U.S.

* cited by examiner

US 7,564,065 B2

LIGHT EMITTING DEVICE AND A LIGHTING APPARATUS

CROSS REFERENCE TO RELATED APPLICATION

This application claims the benefit of priority under 35 U.S.C. § 119 to Japanese Patent Application No. 2004-083399, filed on Mar. 22, 2004, the entire content of which is incorporated by reference herein.

BACKGROUND OF THE INVENTION

1. Field of the Invention

The present invention relates to a light emitting device and a lighting apparatus using the same.

2. Description of the Related Art

In a field of general illumination, a solid-state illumination, specifically, a white light illumination using a semiconductor light emitting diode has attracted a lot of attention and thus researches and developments have been widely vigorously performed on the lighting apparatus.

In addition, such a white light emitting diode lamp has already acquired a luminous efficacy comparable or superior to that of an incandescent lamp, even though the diode lamp is still in the process of development. In the near future, the white light emitting diode lamp is thought to become widely used as energy-saving illumination equipment.

On top of that, the white light emitting diode lamp has another advantage of being free of substances that impose a heavy burden on the environment such as mercury or the like. Moreover, the diode lamp has so small a size that it is quite often used as a backlight source of a liquid crystal display apparatus or the like and built-in in a cellular phone or the like.

The above white light emitting diode lamp utilizes a white light emitting diode composed of a light emitting diode chip that emits a short wavelength light such as blue or the like and a phosphor that is excited by absorbing part or all of the light emitted from the light emitting diode chip and emits a longer wavelength light such as yellow or the like.

As an example of such a diode, there is cited a white light emitting diode composed of a compound semiconductor blue light emitting diode chip and a cerium-activated Yttrium Aluminium Garnet (YAG) phosphor that absorbs blue light and emits yellow light, which is a complementary color of blue (Refer to Japanese Patent Publications No. 2900928 and 2927279 and, "Development of High-bright and Pure-white LED Lamps", K. Bando, K. Sakano, Y. Noguchi and Y. Shimizu, J. Light & Vis. Env. Vol. 22, No. 1 (1998), pp. 2-5).

In addition, a red phosphor may be added in order to compensate a low red component in the spectrum. Specifically, $(Sr_{1-x-y-z}Ba_xCa_y)_2Si_5N_8:Eu_z^{2+}$, SrS:Eu, CaS:Eu, or $(Ca_xSr_{1-x})S:Eu^{2+}$ as a red phosphor is added to a white light emitting diode composed of a blue light emitting diode chip and a cerium-activated YAG phosphor (Refer to Japanese Patent Application Laid-open Publications Nos. 2003-273409 and 2003-321675, and "Red-Enhanced White-Light-Emitting Diode Using a New Phosphor", M. Yamada, T. Naitou, K. Izuno, H. Tamaki, Y. Murazaki, M. Kameshima and T. Mukai, Jpn. J. Appl. Phys. Vol. 42 (2003) pp. L20-L23).

Alternatively, there is another white light emitting diode that is realized with a blue light emitting diode chip, a first phosphor that emits green light upon excitation by blue light, and a second phosphor that emits red light upon excitation by blue light (Refer to Japanese Patent Application Laid-open Publication No. H10-163535).

Moreover, there is yet another white light emitting diode using $SrGa_2S_4:Eu^{2+}$ as a phosphor that emits green light upon excitation by blue light and $SrS:Eu^{2+}$ as a phosphor that emits red light upon excitation by blue light (Refer to "Performance, Thermal, Cost & Reliability challenges for Solid State Lighting", Paul S. Martin, OIDA Conference, May 30, 2002, for example).

Furthermore, an oxynitride phosphor and a nitride phosphor have now been subject to active researches, an example of which is a europium-activated Ca-alpha-SiAlON phosphor (Refer to Japanese Patent Application Laid-open Publication No. 2002-363554, for example). This phosphor emits yellow light when excited by blue light, and thus is preferable as a wavelength conversion material for use in a white light emitting diode.

SUMMARY OF THE INVENTION

In the past, an oxide phosphor and a sulfide phosphor have since stayed in a mainstream as the phosphor for use as a wavelength conversion material. However, in recent years, an oxynitride phosphor and a nitride phosphor, which are superior in terms of a long-term reliability, have been vigorously developed.

On the other hand, again, an oxide phosphor or a sulfide phosphor has still been in a mainstream in an actively studied solid-state lighting apparatus configured by a combination of a semiconductor light emitting device and a phosphor.

Under these circumstances, the inventors of the present invention has accomplished a white light emitting diode lamp that is capable of emitting a warm white light that belongs to a range of an incandescent lamp color by using a blue light emitting diode and a europium-activated Ca-alpha-SiAlON phosphor.

However, from a color rendering evaluation regarding a color of red, which has been conducted for the realized light emitting diode lamp that emits light having an incandescent lamp color, the inventors have come to conclude that there is still a room for improvement in the color rendering property because of low red component in the spectrum.

Therefore, the objective of the present invention is to provide a light emitting device that has high efficacy even in a range of low color temperatures, an excellent long-term reliability, and an improved color rendering property. Another objective is to provide a lighting apparatus using such a light emitting device.

A first aspect of the present invention provides a light emitting device comprising a semiconductor light emitting element that emits purplish blue or blue light, and a phosphor that absorbs part or all of the light emitted from the semiconductor light emitting element and emits fluorescence having a different wavelength from the wavelength of the light. In the light emitting device, the phosphor is a mixture of X percent of a first phosphor material that emits yellow green, yellow or yellow orange light and Y percent of a second phosphor material that emits light having a color of yellow orange or orange and a longer dominant wavelength than the first phosphor material, the first phosphor material and the second phosphor material being mixed in a manner that satisfy all the following relations $0<X\leq100$, $0\leq Y<100$, and $0<(X+Y)\leq100$. In addition, the first phosphor material is a SiAlON phosphor represented by a general formula $Ca_x(Si, Al)_{12}(O, N)_{16}:Eu_y^{2+}$ and a main phase thereof has an alpha SiAlON crystal structure.

A second aspect of the present invention provides a light emitting device according to the first aspect, the SiAlON phosphor has a composition x of from 0.75 to 1.0 and a composition y of from 0.04 to 0.25.

A third aspect of the present invention provides a light emitting device according to the first aspect, the second phosphor material is a nitride red phosphor represented by a general formula $(Sr_{1-x-y-z}Ba_xCa_y)_2Si_5N_8:Eu_z^{2+}$.

A fourth aspect of the present invention provides a second phosphor material is a nitride red phosphor represented by a general formula $Ca_{1-x}AlSiN_3:Eu_x^{2+}$.

A fifth aspect of the present invention provides a light emitting device according to the first aspect, the semiconductor light emitting element is a semiconductor light emitting diode element having an emission center wavelength of from 400 nm to 480 nm.

A six aspect of the present invention provides a lighting apparatus comprising a light emitting device according to the first aspect, a supporting portion in which the light emitting device is attached, and a driver portion configured to drive the light emitting device.

A seventh aspect of the present invention provides a lighting apparatus according to the sixth aspect further comprising a cover that covers the light emitting device, the cover being made of a translucent or a light scattering material.

The light emitting device according to the first aspect comprises a semiconductor light emitting element that emits purplish blue or blue light, and a phosphor that absorbs part or all of the light emitted from said semiconductor light emitting element and emits fluorescence having a different wavelength from the wavelength of said light. In the light emitting device, since the phosphor contains a SiAlON phosphor represented by a general formula $Ca_x(Si, Al)_{12}(O, N)_{16}:Eu_y^{2+}$, the SiAlON phosphor emitting yellow green, yellow or yellow orange light, and a main phase thereof has an alpha SiAlON crystal structure, there is provided a light emitting device that has a high luminous efficacy especially in a range of low color temperatures, a long-term reliability, and an improved color rendering property.

More specifically, the light emitting device according to the first aspect comprises a semiconductor light emitting element that emits purplish blue or blue light, and a phosphor that absorbs part or all of the light emitted from said semiconductor light emitting element and emits fluorescence having a different wavelength from the wavelength of said light, wherein said phosphor is a mixture of X percent of a first phosphor material that emits yellow green, yellow or yellow orange light and Y percent of a second phosphor material that emits light having a longer dominant wavelength in a range of yellow orange or orange than said first phosphor material in a way that said X and said Y satisfy all the following relations $0<X\leq100$, $0\leq Y<100$, and $0<(X+Y)\leq100$, and wherein said first phosphor material is a SiAlON phosphor represented by a general formula $Ca_x(Si, Al)_{12}(O, N)_{16}:Eu_y^{2+}$ and a main phase thereof has an alpha SiAlON crystal structure. Therefore, there is provided a light emitting device that has a high luminous efficacy especially in a range of low color temperatures, a long-term reliability, and an improved color rendering property.

In addition, since the above SiAlON phosphor has a composition x of from 0.75 to 1.0 and a composition y of from 0.04 to 0.25, there is provided a light emitting device that has a high luminous efficacy especially in a range of low color temperatures, an excellent long-term reliability, and an improved color rendering property.

Moreover, since the above second phosphor material is a nitride red phosphor represented by a general formula $(Sr_{1-x-y-z}Ba_xCa_y)_2Si_5N_8:Eu_z^{2+}$, there is provided a light emitting device that has a high luminous efficacy especially in a range of low color temperatures, an excellent long-term reliability, and an improved color rendering property.

Furthermore, since the above second phosphor material is a nitride red phosphor represented by $Ca_{1-x}AlSiN_3:Eu_x^{2+}$, there is provided a light emitting device that has a high luminous efficacy especially in a range of low color temperatures, an excellent long-term reliability, and an improved color rendering property.

In addition, since the above semiconductor light emitting element is a semiconductor light emitting diode element, there is provided a light emitting device that has a high luminous efficacy especially in a range of low color temperatures, an excellent long-term reliability, and an improved color rendering property.

Moreover, since the lighting apparatus according to the sixth aspect is comprised of the above light emitting device, a support portion in which the light emitting device is attached, and a driver portion configured to drive the light emitting device, there is provided a lighting apparatus that has a high luminous efficacy especially in a range of low color temperatures, an excellent long-term reliability, and an improved color rendering property.

Furthermore, because the lighting apparatus according to the sixth aspect is provided with a cover that is made of a translucent material or a light scattering material and covers the light emitting device, light emitted from the light emitting device is prevented from entering directly human eyes.

DESCRIPTION OF THE PREFERRED EMBODIMENTS

Figure 1:
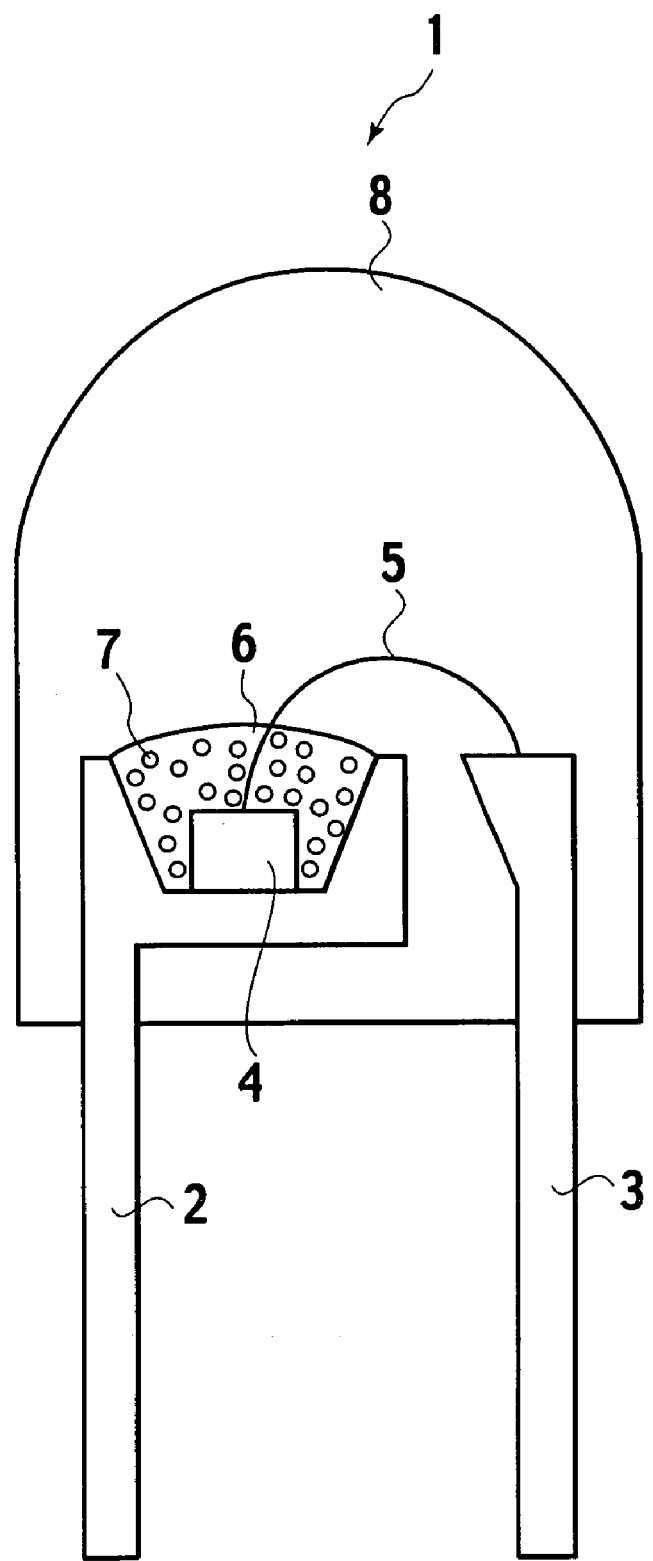
FIG. 1 is a cross-sectional view of a white light emitting diode lamp according to a first embodiment of the present invention.

Referring to accompanying drawings, a light emitting device and a lighting apparatus according to the present invention will be described in detail.

While a white light emitting diode lamp will be described as an example of the light emitting device according to the present invention in the following embodiments, the following embodiments are intended for purposes of illustration only and are not intended to limit the scope of the invention. Therefore, whereas those skilled in the art can devise various types of alternatives, variations and modifications including each and all elements, all the alternatives, variations and modifications fall within the scope of the present invention.

In addition, in all the drawings used as an aid in describing the following embodiments, identical reference numbers will be used to designate identical or corresponding elements, thereby eliminating unnecessary repetition of description about identical elements.

Embodiment 1

In order to overcome the above disadvantages, the inventors of the present invention has improved a color rendering property in a high reliability incandescent (white) light emitting diode lamp by adding a slight amount of a nitride red phosphor to a white light emitting diode lamp that emits a warm light in a range of an incandescent lamp color, the diode lamp being comprised of a blue light emitting diode chip and a europium-activated Ca-alpha-SiAlON, the details of which will be described hereinafter.

Firstly, a first phosphor suitable to embody the present invention will be described hereinafter.

This first phosphor is a divalent-europium-activated Ca-alpha-SiAlON phosphor of which composition is represented by a general formula $Ca_x(Si, Al)_{12}(O, N)_{16}:Eu_y^{2+}$, emitting yellow green, yellow, or yellow orange light. This phosphor is referred to as a SiAlON phosphor, when appropriate, in the following description.

A number of samples of the SiAlON phosphor each having a different value of x and y in the above general formula have been synthesized and their emission characteristics have been compared. As a result, it has been found that the SiAlON phosphor has a high luminous intensity when it has a value of x in a composition range of from 0.75 to 1.0 ($0.75 \leq y \leq 1.0$) and also a value of y in a composition range of from 0.04 to 0.25 ($0.04 \leq y \leq 0.25$).

Secondly, synthesizing of the above SiAlON phosphor will be explained.

As a starting powder material for the SiAlON phosphor, alpha Silicon Nitride (alpha-$Si_3N_4$), Aluminum Nitride (AlN), Calcium Carbonate ($CaCO_3$), and Europium Oxide ($Eu_2O_3$) were prepared.

Then, 65.78 wt % of alpha-$Si_3N_4$ powder, 18.71 wt % of AlN powder, 13.59 wt % of $CaCO_3$ powder, and 1.19 wt % of $Eu_2O_3$ powder were weighed so that the SiAlON represented by $Ca_{0.875}Si_{9.05}Al_{2.94}O_{0.98}N_{15.02}:Eu_{0.07}^{2+}$ would be obtained. A predetermined amount of n-hexane was added to the weighed materials and then the n-hexane-added materials were well mixed by a planetary ball mill for 2 hours.

The mixed materials were desiccated by a rotary evaporator and then pounded well in a mortar. Next, the pounded materials were charged into a covered container made of Boron Nitride.

Then, the sintering process was carried out for the powder materials in the covered container at a temperature of 1,700 degrees Celsius in a 0.5 MPa Nitrogen atmosphere for about 50 hours.

Although the powder materials were solidified into a mass after the sintering, the mass was easily crushed into powder with an application of only a little force.

A powder X-ray diffraction measurement was carried out for the phosphor powder so obtained. As a result, it has been confirmed that the phosphor powder has a Ca-alpha-SiAlON crystal phase (structure).

Now, an explanation will move on to a second phosphor suitable to embody the present invention.

The second phosphor is added in order to compensate a low red component in the emission spectrum, the phosphor emitting yellow orange or orange light.

As a candidate having an optical characteristics that can be used as the second phosphor, there are a (($Zn_{1-x}$, $Cd_x$)S:Cu, Al) phosphor, a (($Zn_{1-x}$, $Cd_x$)S:Cu, Cl) phosphor, a (($Zn_{1-x}$, $Cd_x$)S:Ag, Cl) phosphor, a (($Zn_{1-x}$, $Cd_x$)S:Ag, Al) phosphor, SrS:Eu, and (CaS:Eu, ($Ca_xSr_{1-x}$)S:$Eu^{2+}$).

However, these phosphors are an oxide or a sulfide phosphor. From a viewpoint of a long-term reliability, the second phosphor has to be desirably selected from nitride phosphors.

As a nitride phosphor that can be used as the second phosphor suitable to embody the present invention, there are $(Sr_{1-x-y-z}Ba_xCa_y)_2Si_5N_8:Eu_z^{2+}$ and $Ca_{1-x}AlSiN_3:Eu_x^{2+}$.

Specifically, $Ca_{1-x}AlSiN_3:Eu_x^{2+}$ is excellent and preferable in terms of excitation efficiency and luminous intensity.

Therefore, synthesizing of $Ca_{1-x}AlSiN_3:Eu_x^{2+}$ will be described.

As a starting material for this phosphor, there were prepared alpha-$Si_3N_4$ powder, AlN powder, $Ca_3N_2$ powder, and europium nitride (EuN) synthesized by nitradation of metallic Eu in an ammonium atmosphere.

Then, 34.0735 wt % of alpha-$Si_3N_4$ powder, 29.8705 wt % of AlN powder, 35.9956 wt % of $Ca_3N_2$ powder, and 0.06048 wt % of EuN powder were weighed so as to obtain the phosphor having a composition represented by a formula $Eu_{0.0005}Ca_{0.9995}AlSiN_3$.

Next, these powders were mixed for 30 minutes using a pestle and mortar, both of which are made of agate. The resulting mixture was then pelletized by applying a pressure of 20 MPa using a metal mold so as to obtain a pellet having a diameter of 12 mm and a thickness of 5 mm.

By the way, the above weighing, mixing, and pelletizing processes were performed in a glove box that is capable of realizing a nitrogen atmosphere with as little as 1 ppm or less of moisture and oxygen.

Then, the pellet was placed in a crucible made of Boron Nitride and the crucible was set into an electric furnace equipped with a graphite resistance heater system.

When performing a sintering process, a furnace chamber in which the crucible was placed was evacuated with a diffusion pump and then heated from a room temperature to 800 degrees Celsius at an increment rate of 500 degrees Celsius an hour. When the temperature reached 800 degrees Celsius, nitrogen having a purity of 99.999 vol. % was introduced into the chamber and a pressure therein was kept at 1 MPa. Then, the temperature was raised up to 1,800 degrees Celsius at an increment rate of 500 degrees Celsius an hour and kept at 1,800 degrees Celsius for 2 hours, while keeping the pressure of 1 MPa.

After sintering, the obtained sintered pellet was crushed using again a pestle and mortar made of agate. Then, a powder X-ray diffraction measurement using a K-alpha line of copper (Cu) was performed for the crushed phosphor. The measurement result has revealed that the powder phosphor has a $CaAlSiN_3$ crystal phase (structure).

Optical properties of the first and the second phosphor synthesized as above will be described hereinafter.

The optical properties measurements have been carried out using a fluorescence spectrophotometer. The spectrophotometer is able to correct the spectral distribution based on a calibration performed using Rhodamine B and a standard light source.

Figure 3:
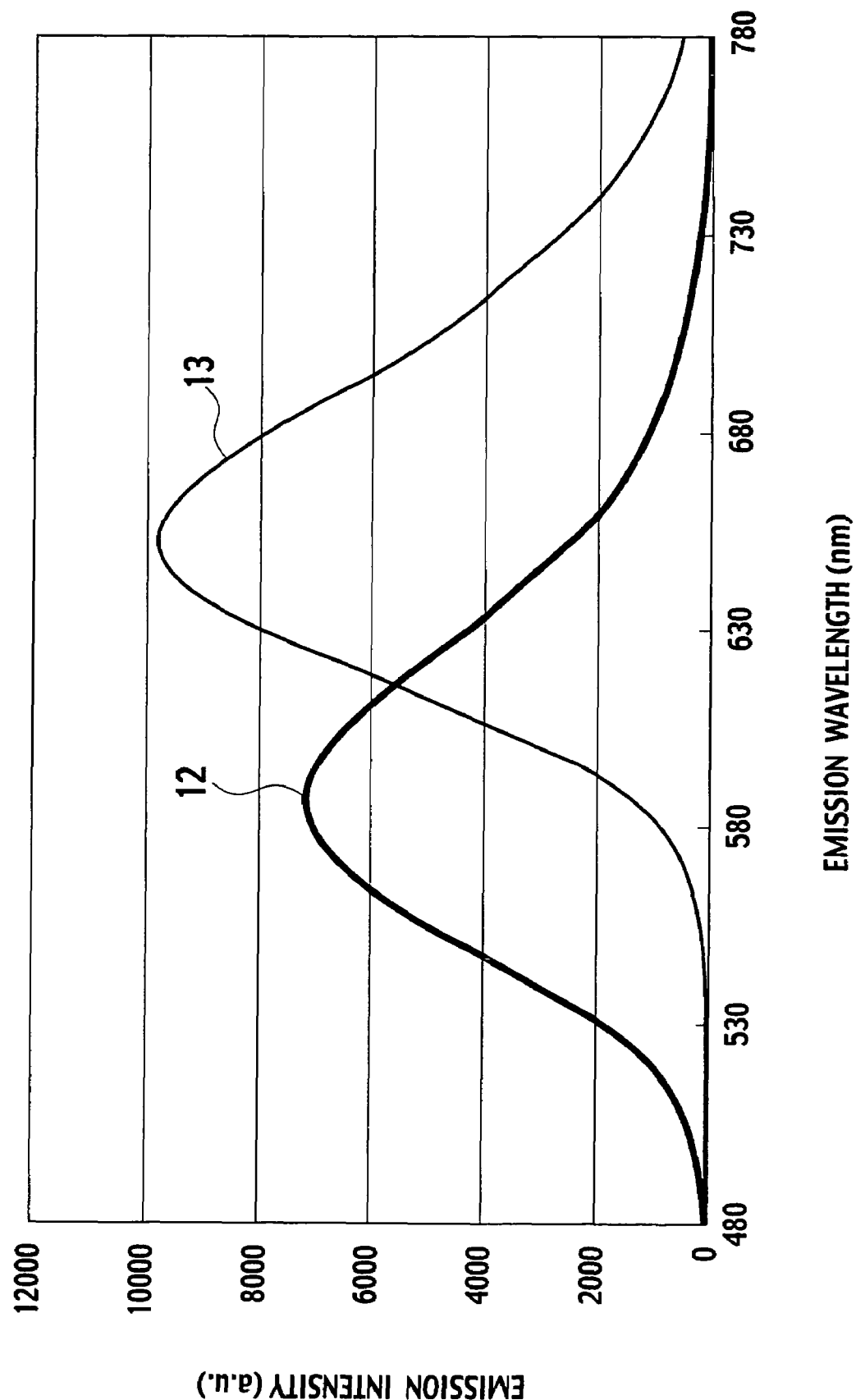
FIG. 3 illustrates an emission spectrum of a phosphor.

FIG. 3 illustrates an emission spectrum of the first and the second phosphor, in which lines 12 and 13 represent the spectrum of the first and the second phosphor, respectively.

By the way, an excitation wavelength was chosen to be 450 nm under the assumption that the phosphors are excited by a blue light emitting diode in a white light emitting diode lamp.

The first phosphor has the chromaticity coordinates of (0.52, 0.48) in the CIE1931 XYZ color specification system and a dominant wavelength of 581 nm. This corresponds to a chromaticity of "KI" (yellow) in the reference FIG. 1 of the Japanese Industrial Standard (JIS) Z 8110.

The second phosphor has the chromaticity coordinates of (0.67, 0.33) in the CIE1931 XYZ color specification system and a dominant wavelength of 612 nm. This corresponds to a chromaticity of "AKA" (red) in the reference FIG. 1 of the Japanese Industrial Standard (JIS) Z 8110.

Figure 4:
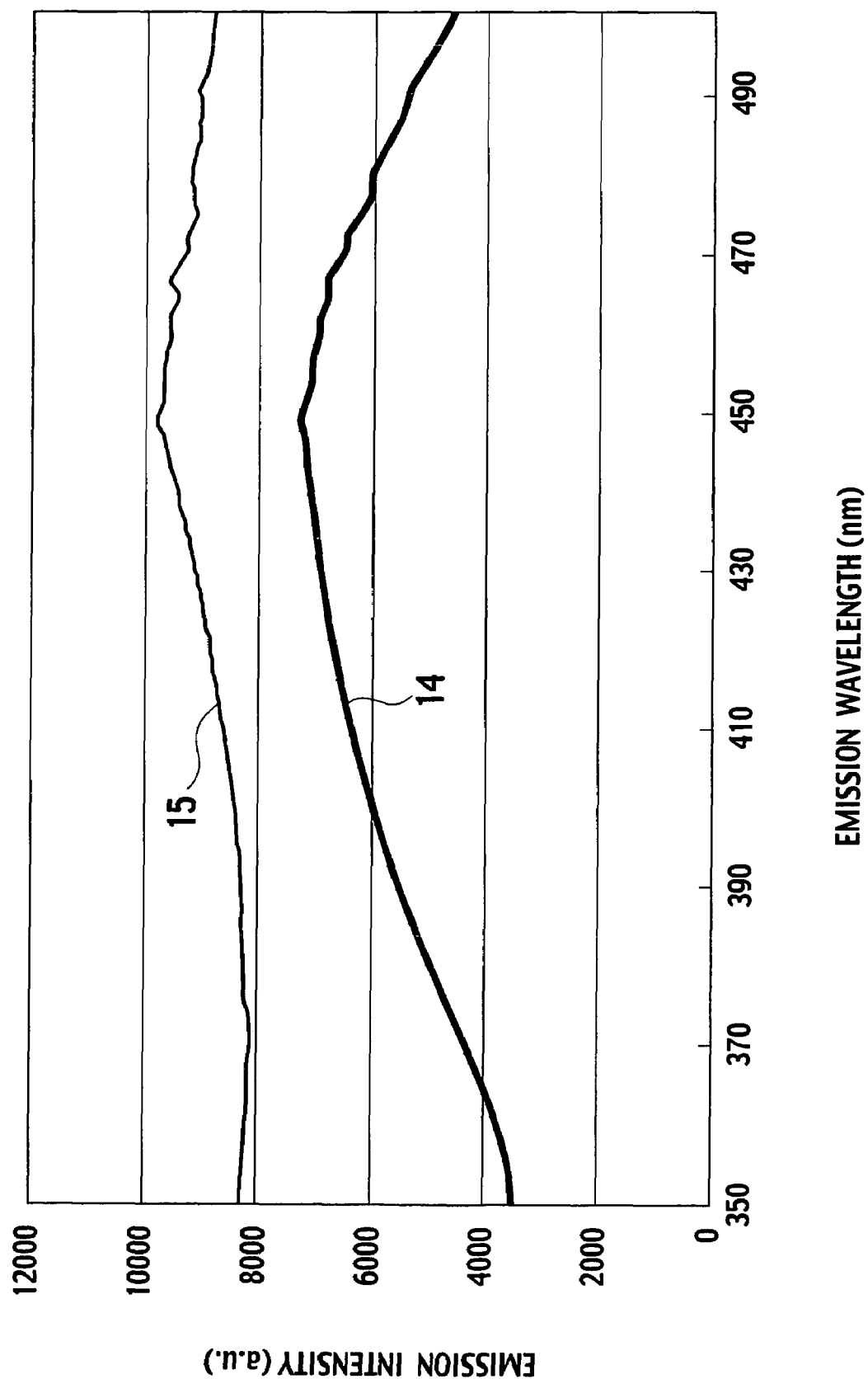
FIG. 4 illustrates an excitation spectrum of a phosphor.

FIG. 4 illustrates an excitation spectrum of the first phosphor and the second phosphor, in which lines 14 and 15 represent the spectrum of the first phosphor and the second phosphor, respectively.

By the way, when measuring an excitation spectrum, an excitation monitoring wavelength was chosen to be 585 nm for the first phosphor, whereas the wavelength was 653 nm for the second phosphor.

Both phosphors have an extremely broad excitation peak in the spectral region of blue, which specifically demonstrates that the phosphors can be excited with high efficiency by blue light having a wavelength of about 450 nm.

Figure 5:
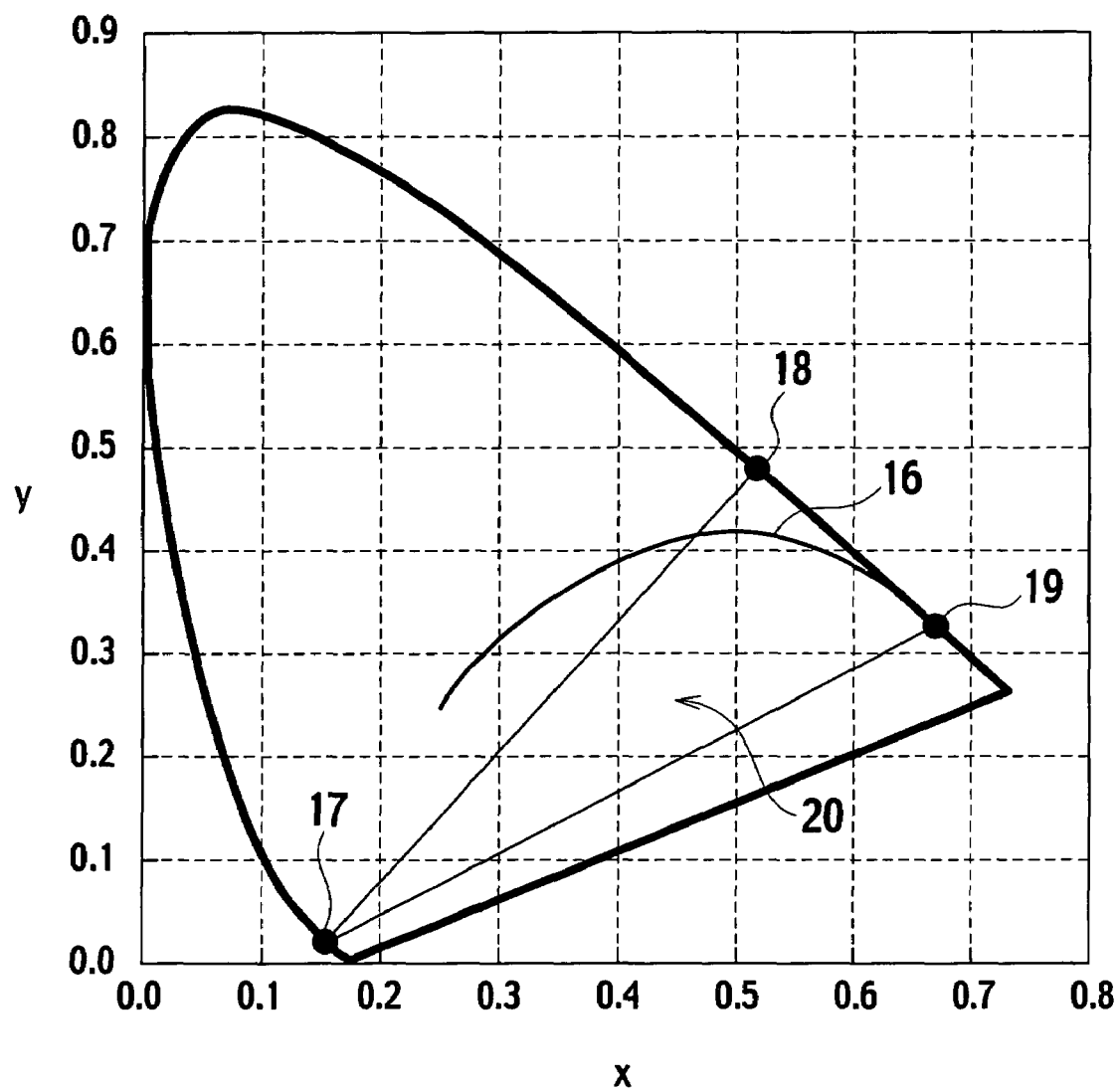
FIG. 5 illustrates chromaticity coordinates of a blue light emitting diode chip and a phosphor.

FIG. 5 illustrates the blackbody radiation locus (a line 16) on the CIE1931 XYZ color specification diagram. In FIG. 5, chromaticity coordinates of a blue light emitting diode chip having an emission center wavelength of 450 nm (a point 17), the first phosphor (a point 18), and the second phosphor (a point 19) are also plotted on the diagram.

This embodiment describes a white light emitting diode lamp having an improved color rendering property accomplished by adding a red component to the white light emitting diode lamp that can emit white light having a low color temperature and a warm tint comparable to a color of incandescent lamp. However, a visible-light emitting diode lamp that emits light having a given neutral color in a triangular area 20 shown in FIG. 5 can be easily realized when the light emitting diode lamp is constructed by a combination of a blue light emitting diode, the first phosphor and the second phosphor. Such a light emitting diode lamp falls within the scope of the present invention.

Next, a white light emitting diode lamp will be described as a first embodiment (embodiment 1) of a light emitting device according to the present invention.

Figure 2:
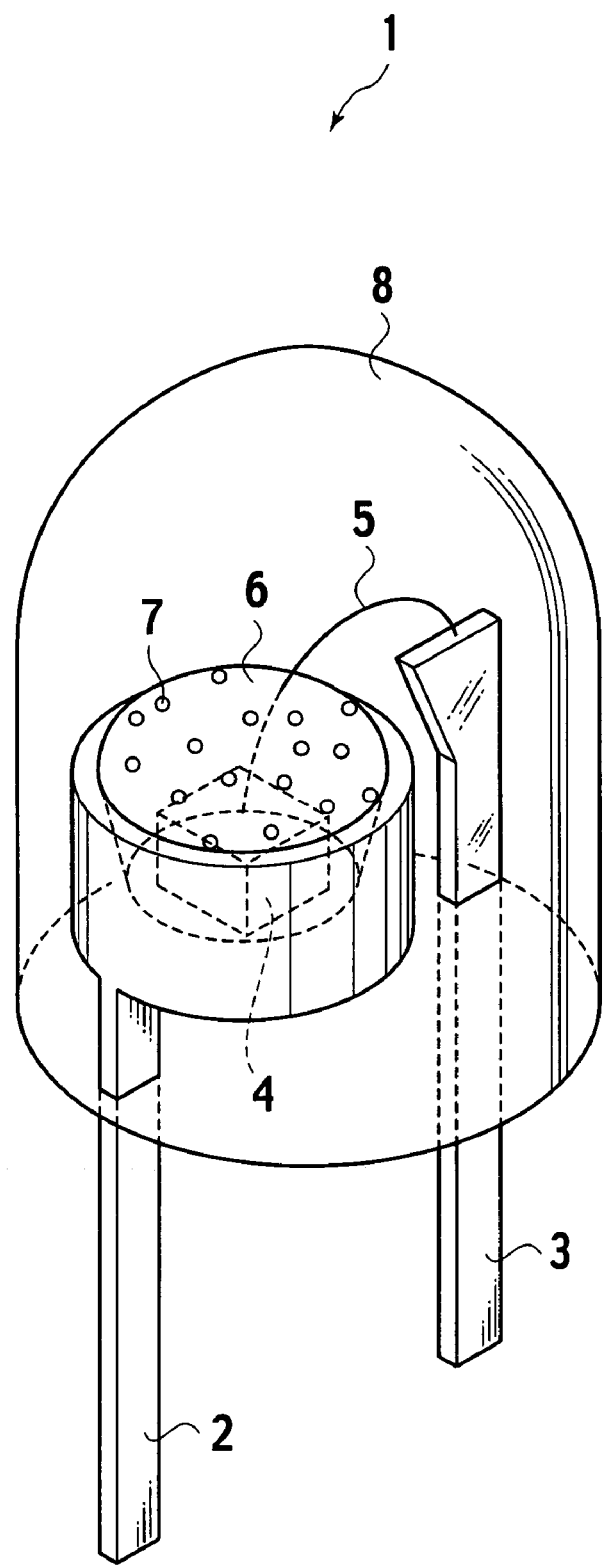
FIG. 2 is a perspective view of a white light emitting diode lamp illustrated in FIG. 1.

FIG. 1 is a cross-sectional view of a white light emitting diode lamp 1 stated above. FIG. 2 is a perspective view of the white light emitting diode lamp 1 illustrated in FIG. 1.

The white light emitting diode lamp 1 is formed into a tubular shape with a round end at its top, in other words, a shape resembling an artillery shell. The white light emitting diode lamp 1 includes lead wires 2, 3, a blue light emitting diode chip (semiconductor light emitting element) 4, a bonding wire 5, an above-mentioned phosphor 7, a transparent first resin 6, and a second resin 8. The lower portion of the lead wires 2, 3 is exposed out of the second resin 8.

At the upper end of the lead wire 2, there is provided a cup in which a blue light emitting diode chip 4 is placed. The blue light emitting diode chip 4 is electrically connected with the lead wire 2 by die bonding or the like using electrically conductive paste. The light emitting diode chip 4 is also electrically connected with the lead wire 3 by wire bonding or the like using the bonding wire 5.

In addition, the vicinities of the blue light emitting diode chip 4, including the recess of the above-stated cup, are sealed with the first resin 6 into which the phosphor 7 is dispersed.

Furthermore, the lead wires 2, 3, the blue light emitting diode chip 4, the bonding wire 5, and the first resin 6 are sealed with the second resin 8.

As the blue light emitting diode chip 4, a light emitting diode chip having an emission center wavelength of 400 nm to 480 nm is preferable. Specifically, a diode chip having an emission center wavelength of 450 nm is more preferable since the SiAlON phosphor can be efficiently excited by the light having the wavelength. The blue light emitting diode chip actually used in this embodiment was turned out to have an emission center wavelength of 454 nm from a measurement.

Next, a manufacturing procedure will be described about the white light emitting diode lamp 1.

In a first process, the first phosphor and the second phosphor as the phosphor 7 are weighed and mixed.

In a second process, the light emitting diode chip 4 is die-bonded in the cup at the tip of the lead wire 2 with electrically conductive paste.

In a third process, the blue light emitting diode chip 4 is wire-bonded to the lead wire 3 with the bonding wire 5.

In a fourth process, the first resin 6 dispersed with the SiAlON phosphor 7 of 35 wt % is pre-deposited onto the element-accommodating cup so as to coat the light emitting diode chip 4 and then cured.

In a fifth process, the second resin 8 is deposited to enfold the lead wires 2, 3, the blue light emitting diode chip 4 and the first resin 6, and then cured. This fifth process is ordinarily carried out by casting.

In the meanwhile, the lead wires 2, 3 can be made as an integral member in which both of the wires are connected at their ends. When using such lead wires, a sixth process has to be adopted after the fifth process, wherein the connecting portion between the lead wires 2, 3 is removed to separate the lead wires 2, 3 into an individual member.

By the way, the same epoxy resin is used as the first resin 6 and the second resin 8.

In this embodiment, the phosphor 7 is dispersed in the first resin 6. However, the present invention is not limited to this embodiment. For instance, the phosphor 7 can be dispersed in a single resin that can enfold the lead wires 2, 3, the blue light emitting diode chip 4, and the bonding wire 5, the single resin being analogous to the second resin 8 in this embodiment.

In addition, this embodiment has described in detail the light emitting diode chip 4 having one electrode on an upper side (i.e., on the side to be connected with the bonding wire 5) and the other on a lower side (i.e., on the side to contact with the element-accommodating cup), a light emitting diode chip having two electrodes on the upper side and none on the lower side can be used.

In this case, as long as the blue light emitting diode chip 4 is firmly fixed on the lead wire, an electrically conductive paste is not necessarily required in the second process. Instead, two bonding wires are required in the third process.

Moreover, the shape of lead wires in the embodiments according to the present invention is not limited to that illustrated here as long as the light emitting diode chip can be fixed.

Figure 6:
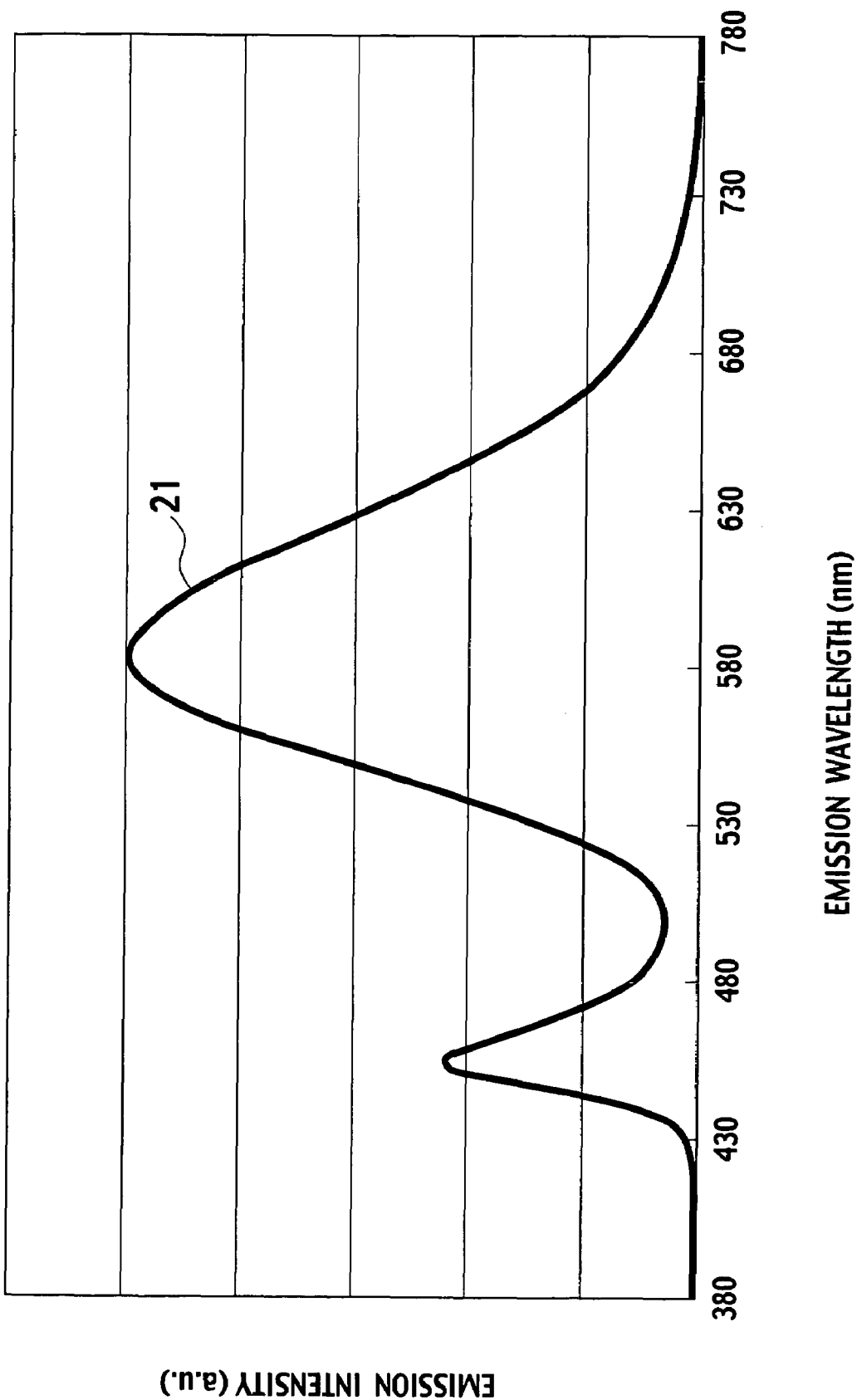
FIG. 6 illustrates an emission spectrum of a white light emitting diode lamp using only a first phosphor.

FIG. 6 illustrates an emission spectrum (a line 21) of a white light emitting diode lamp 1 in which only the first phosphor is used as the above phosphor 7. The spectrum was measured using a high speed LED tester.

This white light emitting diode lamp 1 has the chromaticity coordinates of (0.46, 0.41) in the CIE1931 XYZ color specification system. It has been found from this result that an extremely excellent high-bright white light emitting diode lamp is realized which has a warm nuance in a range of incandescent lamp color.

Figure 7:
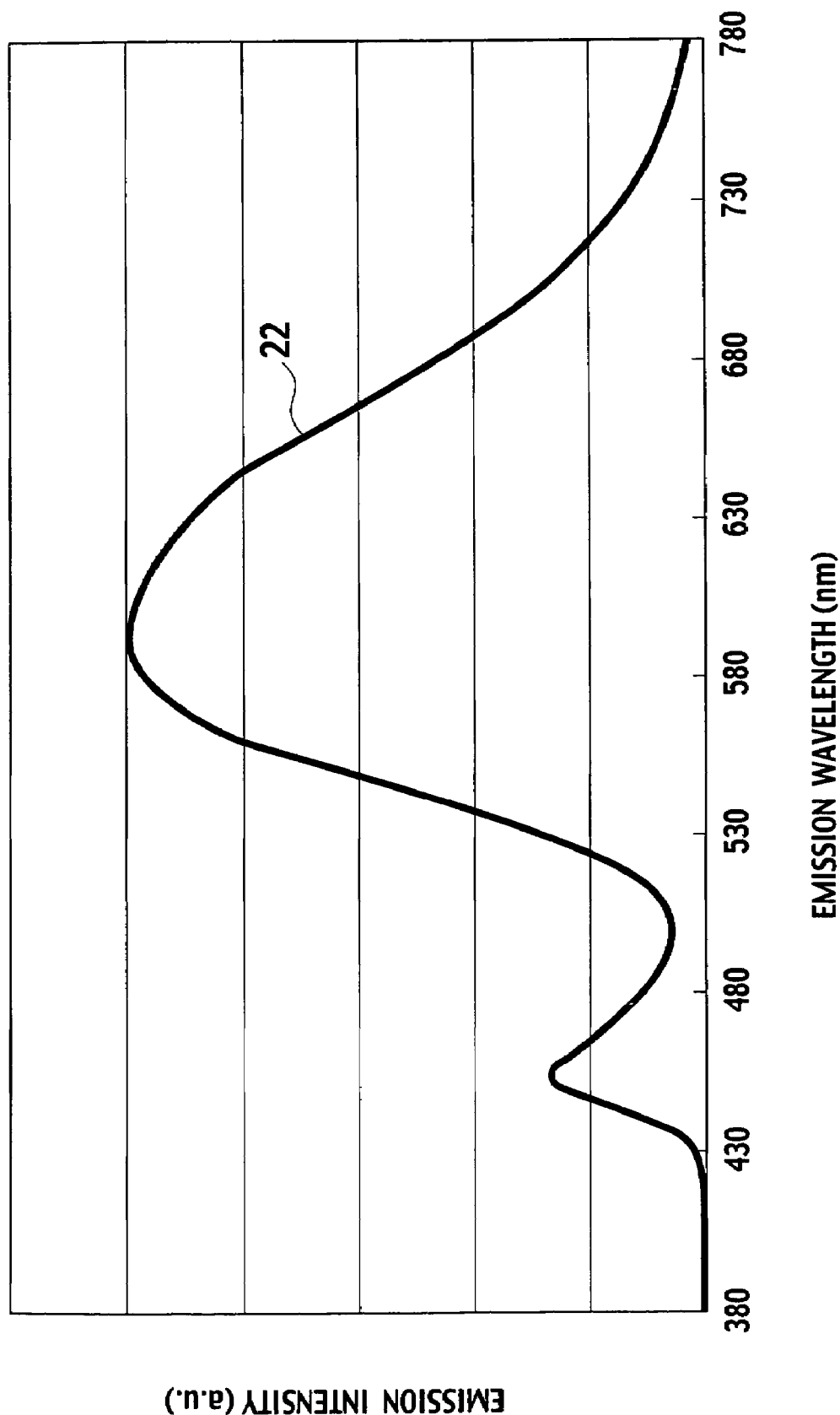
FIG. 7 illustrates an emission spectrum of a white light emitting diode lamp using a first phosphor and a second phosphor.

FIG. 7 illustrates an emission spectrum (a line 22) of a white light emitting diode lamp 1 that uses a mixture of the first phosphor and the second phosphor at a ratio of 3 (the first) to 1 (the second) as the phosphor 7 stated above.

By the way, in this white light emitting diode lamp 1 having both phosphors, a slightly increased amount of the first resin in which the phosphor 7 is dispersed is applied compared with the white light emitting diode lamp of which emission spectrum is illustrated in FIG. 6, in order to make the chromaticity thereof correspond to the above-mentioned blackbody radiation locus.

This white light emitting diode lamp of which emission spectrum illustrated in FIG. 7 has the chromaticity coordinates of (0.50, 0.42) in the CIE1931 XYZ color specification system.

As mentioned above, a color rendering index is improved from Ra55 to Ra65 by adding the second phosphor to the white light emitting diode lamp using the first phosphor. The index value of 65 indicates that the white light emitting diode lamp that uses both phosphors is comparable to a usual fluorescent lamp having the index of 60 and applicable for general illumination.

Figure 8:
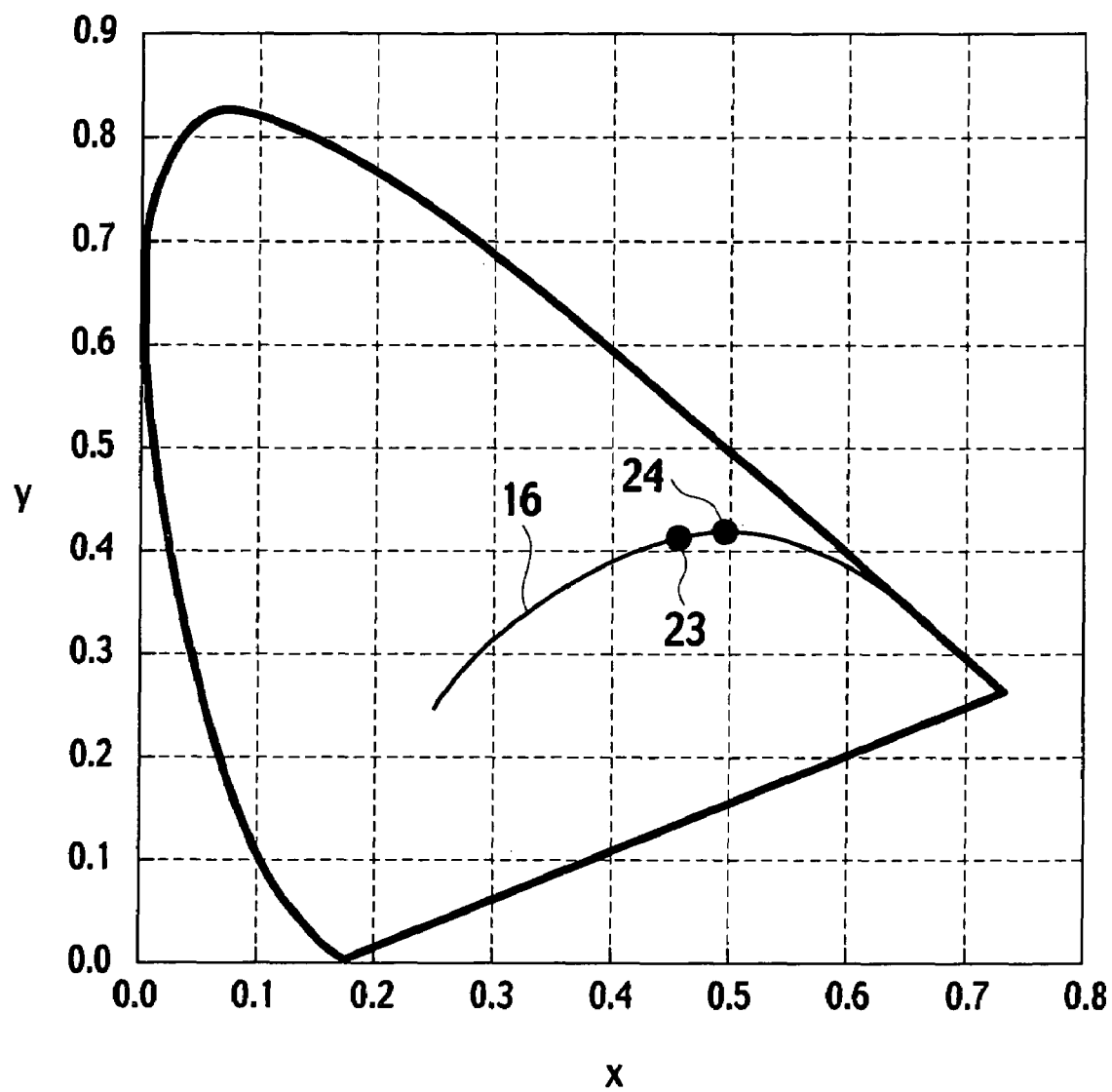
FIG. 8 illustrates chromaticity coordinates of a white light emitting diode lamp.

By the way, as shown in FIG. 8, both the chromaticity coordinates (a point 23) of the white light emitting diode lamp having the emission spectrum illustrated in FIG. 6 and the chromaticity coordinates (a point 24) of the white light emitting diode lamp having the emission spectrum illustrated in FIG. 7 lie on the black-body radiation locus 16. A color temperature is 2750 K in case of the white light emitting diode lamp using only the first phosphor (FIG. 6) and 2300 K in case of the white light emitting diode lamp using a mixture of the first phosphor and the second phosphor (FIG. 7).

From the foregoing, by using an oxynitride and a nitride phosphor, high reliability and improved color rendering property as a result of a compensation of red component have been accomplished in the white light emitting diode lamp that can emit white light having a warm nuance and low color temperature.

Embodiment 2

A lighting apparatus according to a second embodiment (embodiment 2) will be described hereinafter.

Figure 9:
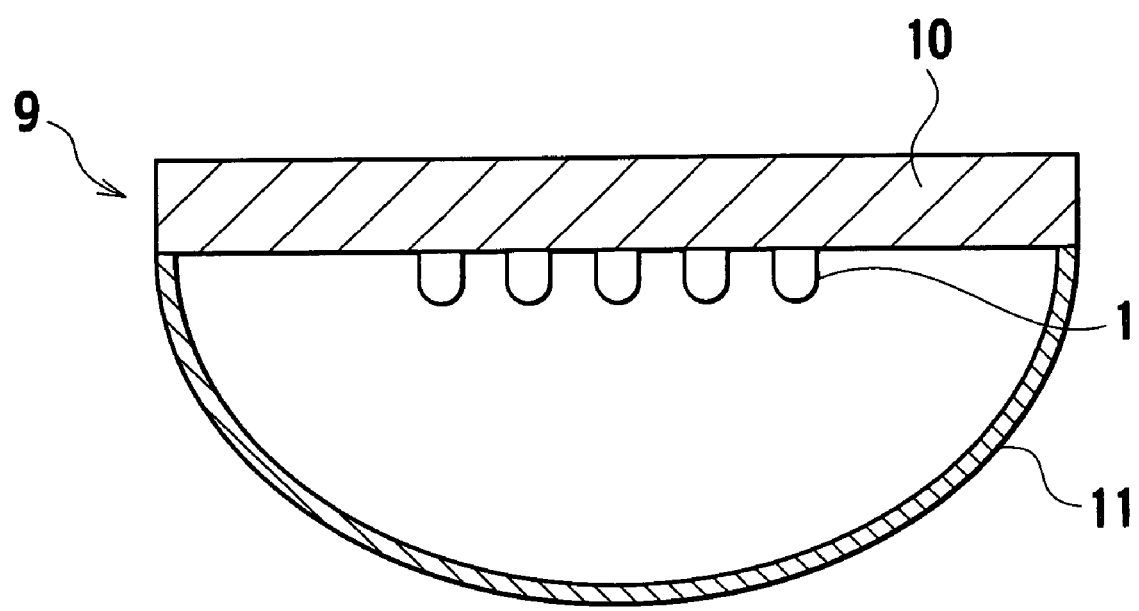
FIG. 9 is a cross-sectional view of a lighting apparatus according to a second embodiment of the present invention.

FIG. 9 is a cross-sectional view of a lighting apparatus 9. The lighting apparatus 9 is comprised of one or a plurality of white light emitting diode lamp(s) 1, a support portion 19 in which the white light emitting diode lamp(s) 1 is attached, a lamp driver (light emitting device driver) (not shown) that supply electricity to the white light emitting diode lamp(s) 1, and a cover 11 that covers the white light emitting diode lamp(s) 1, the cover 11 being is made of a translucent or a light scattering material.

The support portion 10 is a box-shaped member having a predetermined degree of strength and is constructed so as to be fixed on a ceiling or a sidewall of a house or a building.

The lamp driver is an electric circuit built-in in the support portion 10 and utilizes an external electric power supply to turn on the white light emitting diode lamp(s) 1.

In addition, the lamp driver is usually comprised of a power supply circuit, a driver integral circuit (IC), and their peripheral parts.

Moreover, the driver IC can have a pulse drive function in order to pulse-drive the white light emitting diode lamp(s) 1 as well as a dimmer function.

In the support portion 10, one or a plurality of white light emitting diode lamp(s) 1 is (are) placed and connected electrically with the lamp driver.

The cover 11 is disposed so as to cover entirely the white light emitting diode lamp(s) 1. The cover 11 is formed of a translucent or a light scattering material. As an example of the light scattering material, there are a smoky glass and a resin having a given roughness on the surface thereof.

Due to the cover 11, white light emitted from the white light emitting diode lamp 1 cannot be directly incident upon human eyes. In addition, the cover 11 allows a user of the lighting apparatus 9 to recognize that the light is emitted entirely from the lighting apparatus 9, thereby preventing the brightness of the white light emitting diode lamp 1 from annoying a user of the lighting apparatus 9, even when the white light emitting diode lamp is highly bright.

According to the present invention, there is realized a light emitting diode lamp and a lighting apparatus that are highly reliable since an oxynitride and a nitride phosphor that are superior to an oxide or a sulfide phosphor in terms of a long term reliability. In addition, a color rendering property is also improved by compensating a red component.

Although the present invention has been described in reference with the foregoing specific embodiments, other alternatives, variations and modifications will be apparent to one skilled in the art. Those alternatives, variations and modifications are intended to fall within the spirit and scope of the appended claims.

What is claimed is:

1. A light emitting device comprising:
   a semiconductor light emitting element that emits purplish blue or blue light, and
   a phosphor that absorbs part or all of the light emitted from said semiconductor light emitting element and emits fluorescence having a different wavelength from the wavelength of said light,
   wherein said phosphor is a mixture of X percent of a first phosphor material that emits yellow green, yellow or yellow orange light and Y percent of a second phosphor material that emits light having a color of yellow orange or orange and a longer dominant wavelength than said first phosphor material, said first and said second phosphor material being mixed in a manner that satisfy all the following relations $0<X\leq100$, $0\leq Y<100$, and $0<(X+Y)\leq100$, and
   wherein said first phosphor material is a SiAlON phosphor represented by a general formula $Ca_x(Si, Al)_{12}(O,N)_{16}:Eu_y^{2+}$ and a main phase thereof has an alpha SiAlON crystal structure, wherein said SiAlON phosphor has a composition x of from 0.75 to 1.0 and a composition y of from 0.04 to 0.25; and
   wherein said second phosphor material is a nitride red phosphor represented by a general formula $Ca_{1-x}AlSiN_3:Eu_x^{2+}$, wherein both Ca and Eu are present in said second phosphor material.

2. A light emitting device according to claim 1, wherein said semiconductor light emitting element is a semiconductor light emitting diode element having an emission center wavelength of from 400 nm to 480 nm.

3. A lighting apparatus comprising:
   a light emitting device according to claim 1,
   a supporting portion in which said light emitting device is attached, and
   a driver portion configured to drive said light emitting device.

4. A lighting apparatus according to claim 3, further comprising a cover that covers said light emitting device, the cover being made of a translucent or a light scattering material.

* * * * *